(12) United States Patent
Xu et al.

(10) Patent No.: US 10,082,819 B2
(45) Date of Patent: Sep. 25, 2018

(54) SWITCHED-CAPACITOR BANDGAP REFERENCE CIRCUIT USING CHOPPING TECHNIQUE

(71) Applicant: Marvell World Trade Ltd., St. Michael (BB)

(72) Inventors: Weiwei Xu, San Jose, CA (US); Prasanna Upadhyaya, San Jose, CA (US); Norman Liu, San Mateo, CA (US); Xiaoyue Wang, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/335,367

(22) Filed: Oct. 26, 2016

(65) Prior Publication Data

US 2017/0115684 A1    Apr. 27, 2017

(51) Int. Cl.
*H03K 17/00*    (2006.01)
*G05F 3/30*    (2006.01)
*H03F 3/393*    (2006.01)
*H03F 3/45*    (2006.01)

(52) U.S. Cl.
CPC ............... *G05F 3/30* (2013.01); *H03F 3/393* (2013.01); *H03F 3/45475* (2013.01); *H03F 3/45968* (2013.01); *H03F 2200/271* (2013.01); *H03F 2203/45044* (2013.01); *H03F 2203/45286* (2013.01)

(58) Field of Classification Search
None
See application file for complete search history.

(56) References Cited

U.S. PATENT DOCUMENTS

| | | | | |
|---|---|---|---|---|
| 5,220,327 | A | * | 6/1993 | Abbiate ............. H03H 17/0614 341/143 |
| 9,261,415 | B1 | * | 2/2016 | Zhang ........................ G05F 3/30 |
| 9,804,631 | B2 | * | 10/2017 | Fort ......................... G05F 3/267 |
| 2011/0026347 | A1 | * | 2/2011 | Fort ......................... G11C 7/065 365/207 |

(Continued)

OTHER PUBLICATIONS

Wiessflecker, Martin et al., "A sub 1V self clocked switched capacitor bandgap reference with a current consumption of 180nA", 2012, pp. 2841-2844, IEEE.

*Primary Examiner* — Lincoln Donovan
*Assistant Examiner* — Khareem E Almo

(57) ABSTRACT

A method includes providing a first voltage to a first output node during a first time interval, providing a second voltage to the first output node during a second time interval, and averaging the first and second voltages to provide a reference voltage to a second output node. The first voltage includes a proportional-to-absolute-temperature (PTAT) component, a complementary-to-absolute-temperature (CTAT) component, and a first residual offset component. The second voltage includes the PTAT component, the CTAT component, and a second residual offset component. An apparatus includes a discrete-time circuit to provide the first voltage to the first output node during the first time interval and to provide the second voltage to the first output node during the second time interval, and a filter to average the first and second voltages to provide the reference voltage to the second output node.

20 Claims, 5 Drawing Sheets

(56) References Cited

U.S. PATENT DOCUMENTS

2014/0169512 A1\* 6/2014 Park .................... H03H 19/004
  375/350
2017/0115684 A1\* 4/2017 Xu ............................ G05F 3/30
2017/0255220 A1\* 9/2017 Sivakumar .............. G05F 3/267

\* cited by examiner

SWITCHED-CAPACITOR BANDGAP REFERENCE CIRCUIT USING CHOPPING TECHNIQUE

CROSS REFERENCE TO RELATED APPLICATION

This present disclosure claims the benefit of U.S. Provisional Application No. 62/246,203 filed on Oct. 26, 2015, which is incorporated by reference herein in its entirety.

BACKGROUND

A bandgap reference circuit generates an output voltage that is substantially independent of a temperature variation, and thus has been used in integrated circuits to supply one or more of stable operating voltages. In order to supply the operating voltages, a conventional bandgap reference circuit adds a proportional-to-absolute-temperature (PTAT) voltage to a complementary-to-absolute-temperature (CTAT) voltage. For example, a CMOS bandgap reference circuit includes a complementary metal-oxide semiconductor (CMOS) operational amplifier (op-amp) to generate the PTAT voltage. However, an offset of the CMOS op-amp may result in an output voltage with significant temperature drift.

SUMMARY

In an embodiment, a method includes providing a first voltage to a first output node during a first time interval, providing a second voltage to the first output node during a second time interval, and averaging the first and second voltages to provide a reference voltage to a second output node. The first voltage includes a proportional-to-absolute-temperature (PTAT) component, a complementary-to-absolute-temperature (CTAT) component, and a first residual offset component. The second voltage includes the PTAT component, the CTAT component, and a second residual offset component.

In an embodiment, the method further includes coupling a first end of a first capacitive element to the first output node according to a first switching signal, and coupling a first end of a second capacitive element to the first output node according to a second switching signal. A second end of the first capacitive element and a second end of the second capacitive element are coupled to a ground.

In an embodiment, the method further includes coupling a first end of a third capacitive element to the first end of the first capacitive element and the first end of the second capacitive element according to a third switching signal. The first end of the third capacitive element is coupled to the second output node and a second end of the third capacitive element is coupled to the ground.

In an embodiment, the method further includes coupling a first input node to a first signal path of a chopped operational amplifier (op-amp) according to a clock signal indicative of a first value and a phase signal indicative of a first phase, coupling the first output node to a second signal path of the chopped op-amp according to the clock signal indicative of the first value and the phase signal indicative of the first phase, coupling first ends of first, second, and third capacitive elements to the second signal path of the chopped op-amp according to the phase signal indicative of the first phase, and coupling a second end of the third capacitive element to a around according to the clock signal indicative of the first value.

In an embodiment, the method further includes coupling a second input node to the first signal path of the chopped op-amp according to the clock signal indicative of a second value and the phase signal indicative of the first phase, decoupling the second end of the third capacitive element from the ground according to the clock signal indicative of the second value, coupling a second end of the second capacitive element to the second end of the third capacitive element according to the clock signal indicative of the second value, and adjusting a level of a voltage at the first output node to provide the first voltage.

In an embodiment, the method further includes coupling the first input node to a third signal path of the chopped op-amp according to the clock signal indicative of the first value and the phase signal indicative of a second phase, and coupling the first ends of the first, second, and third capacitive elements to a fourth signal path of the chopped op-amp according to the phase signal indicative of the second phase.

In an embodiment, the method further includes coupling a second input node to the third signal path of the chopped op-amp according to the clock signal indicative of a second value and the phase signal indicative of the second phase, decoupling the second end of the third capacitive element from the ground according to the clock signal indicative of the second value, coupling a second end of the second capacitive element to the second end of the third capacitive element according to the clock signal indicative of the second value, and adjusting a level of a voltage at the first output node to provide the second voltage.

In an embodiment, the method further includes generating a PTAT current using a first chopped operational amplifier (op-amp) according to a phase signal indicative of a first phase, and multiplying the PTAT component, the CTAT component, and the first residual offset component and adding the multiplied PTAT component, CTAT component, and first residual offset component to provide the first voltage using a second chopped op-amp according to the phase signal indicative of the first phase and a clock signal.

In an embodiment, the method further includes multiplying the PTAT component, the CTAT component, and the second residual offset component and adding the multiplied PTAT component, CTAT component, and second residual offset component to provide the second voltage using the second chopped op-amp according to the phase signal indicative of a second phase and the clock signal. Each of the first and second residual offset components is associated with a first offset of the first chopped op-amp and a second offset of the second chopped op-amp.

In an embodiment, an apparatus includes a discrete-time circuit to provide a first voltage to a first output node during a first time interval and to provide a second voltage to the first output node during a second time interval, and a filter to average the first and second voltages to provide a reference voltage to a second output node. The first voltage includes a proportional-to-absolute-temperature (PTAT) component, a complementary-to-absolute-temperature (CTAT) component, and a first residual offset component. The second voltage includes the PTAT component, the CTAT component, and a second residual offset component.

In an embodiment, the filter includes a first capacitive element coupled to the first output node and a ground, a first switching device to couple a first end of the first capacitive element to the first output node according to a first switching signal, a second capacitive element coupled to the first output node and the ground, and a second switching device to couple a first end of the second capacitive element to the first output node according to a second switching signal. A second end of the first capacitive element and a second end of the second capacitive element are coupled to the ground.

In an embodiment, the filter further includes a third capacitive element coupled to the second output node and the ground, a third switching device to couple a first end of the third capacitive element and a third output node according to a third switching signal, a fourth switching device to couple the first end of the first capacitive element to the third output node according to a fourth switching signal, and a fifth switching device to couple the first end of the second capacitive element to the third output node according to a fifth switching signal.

In an embodiment, the discrete-time circuit is a switched capacitor circuit, and the switched capacitor circuit includes a chopped operational amplifier (op-amp) including a first switching network, an op-amp, a second switching network, and an output, the first and second switching networks to provide first and second signal paths according to a phase signal indicative of a first phase, a first switching device to couple a first input node to the first signal path of the chopped op-amp according to a clock signal indicative of a first value, a second switching device to couple the first output node to a second signal path of the chopped op-amp according to the clock signal indicative of the first value, first, second, and third capacitive elements each having a first end coupled to the second signal path of the chopped op-amp, and a third switching device to couple a second end of the third capacitive element to a ground according to the clock signal indicative of the first value.

In an embodiment, the switched capacitor circuit further includes a fourth switching device to couple a second input node to the first signal path of the chopped op-amp according to the clock signal indicative of a second value, and a fifth switching device to couple a second end of the second capacitive element to the second end of the third capacitive element according to the clock signal indicative of the second value. The third switching device decouples the second end of the third capacitive element from the ground according to the clock signal indicative of the second value. The chopped op-amp adjusts a level of the output coupled to the first output node to provide the first voltage.

In an embodiment, the first and second switching networks provides third and fourth signal paths according to the phase signal indicative of a second phase, the first switching device couples the first input node to the third signal path of the chopped op-amp according to the clock signal indicative of the first value, and the first ends of the first, second, and third capacitive elements are coupled to the fourth signal path of the chopped op-amp.

In an embodiment, the switched capacitor circuit further includes a fourth switching device to couple a second input node to the third signal path of the chopped op-amp according to the clock signal indicative of a second value, and a fifth switching device to couple a second end of the second capacitive element to the second end of the third capacitive element according to the clock signal indicative of the second value. The third switching device decouples the second end of the third capacitive element from the ground according to the clock signal indicative of the second value. The chopped op-amp adjusts a level of the output coupled to the first output node to provide the second voltage.

In an embodiment, the discrete-time circuit is a switched capacitor circuit, and the apparatus further includes a bandgap core to generate a PTAT current according to a phase signal. The bandgap core including a first chopped operational amplifier (op-amp), the first chopped op-amp including a first switching network, a first op-amp, a second switching network, and a third switching network. The switched capacitor circuit is configured to multiply the PTAT component, the CTAT component, and the first residual offset component and to add the multiplied PTAT component, CTAT component, and first residual offset component to provide the first voltage according to the phase signal indicative of a first phase and a clock signal. The switched capacitor circuit includes a second chopped op-amp, the second chopped op-amp including a fourth switching network, a second op-amp, and a fifth switching network.

In an embodiment, the switched capacitor circuit is further configured to multiply the PTAT component, the CTAT component, and the second residual offset component and to add the multiplied PTAT component, CTAT component, and second residual offset components to provide the second voltage according to the phase signal indicative of a second phase and the clock signal. Each of the first and second residual offset components is associated with a first offset of the first op-amp and a second offset of the second op-amp.

In an embodiment, the discrete-time circuit provides the first voltage including the first residual offset component during the first time interval to the filter, and provides the second voltage including the second residual offset component during the second time interval to the filter. During a third time interval, the filter averages the first voltage and the second voltage and cancels out the first and second residual offset components to generate a reference voltage. Thus, the filter outputs the reference voltage that is substantially independent of the first offset of the first op-amp and the second offset of the second op-amp.

DETAILED DESCRIPTION

Figure 1:
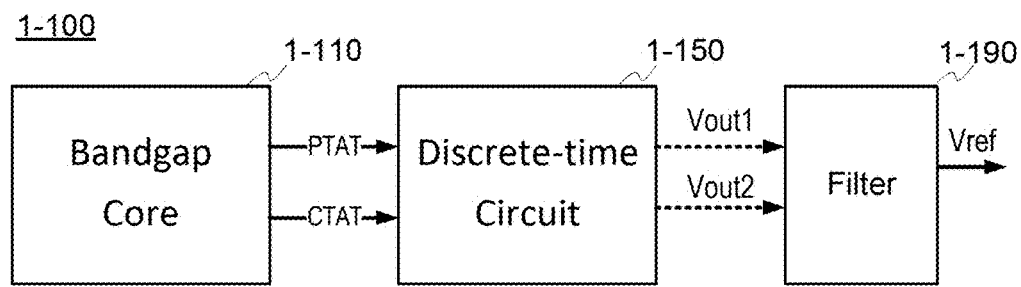
FIG. 1 is a handclap reference circuit according to an embodiment.

FIG. 1 is a block diagram of a bandgap reference circuit 1-100 according to an embodiment. The bandgap reference circuit 1-100 includes a bandgap core 1-110, a discrete-time circuit 1-150, and a filter 1-190.

The bandgap core 1-110 generates a proportional-to-absolute-temperature (PTAT) current and provides a PTAT voltage and a complementary-to-absolute-temperature (CTAT) voltage to the discrete-time circuit 1-150. In an embodiment, the bandgap core 1-110 includes a resistor, bipolar junction transistors (BJTs), and a first chopped op-amp that performs a first chopping operation.

The discrete-time circuit 1-150 multiplies the PTAT voltage, the CTAT voltage, and a residual offset voltage, and adds the multiplied PTAT voltage, CTAT voltage, and the residual offset voltage to provide a voltage to the filter 1-190. The discrete-time circuit 1-150 provides a first voltage $V_{out1}$ to the filter 1-190 during a first time interval, and the first voltage $V_{out1}$ includes a proportional-to-absolutetemperature (PTAT) component, a complementary-to-absolute-temperature (CTAT) component, and a first residual offset component. The discrete-time circuit 1-150 provides a second voltage $V_{out2}$ to the filter 1-190 during a second time interval, and the second voltage $V_{out2}$ includes the PTAT component, the CTAT component, and a second residual offset component. In an embodiment, the discrete-time circuit 1-150 is a switched capacitor circuit that includes a plurality of switching devices, a plurality of capacitive elements, and a second chopped op-amp that performs a second chopping operation.

In an embodiment, the first chopped op-amp includes a first switching network, a first op-amp, a second switching network, and a third switching network, and the second chopped op-amp includes a fourth switching network, a second op-amp, and a fifth switching network. In this embodiment, the residual offset voltage corresponds to a remaining portion of offsets of the first and second op-amps after the first and second chopping operations have been performed.

The filter 1-190 averages the first voltage $V_{out1}$ and the second voltage $V_{out2}$ and cancels out the first and second residual offset components to generate a reference voltage $V_{ref}$. Thus, the filter 1-190 outputs the reference voltage $V_{ref}$ that is substantially independent of the offsets of the first and second op-amps.

Figure 2:
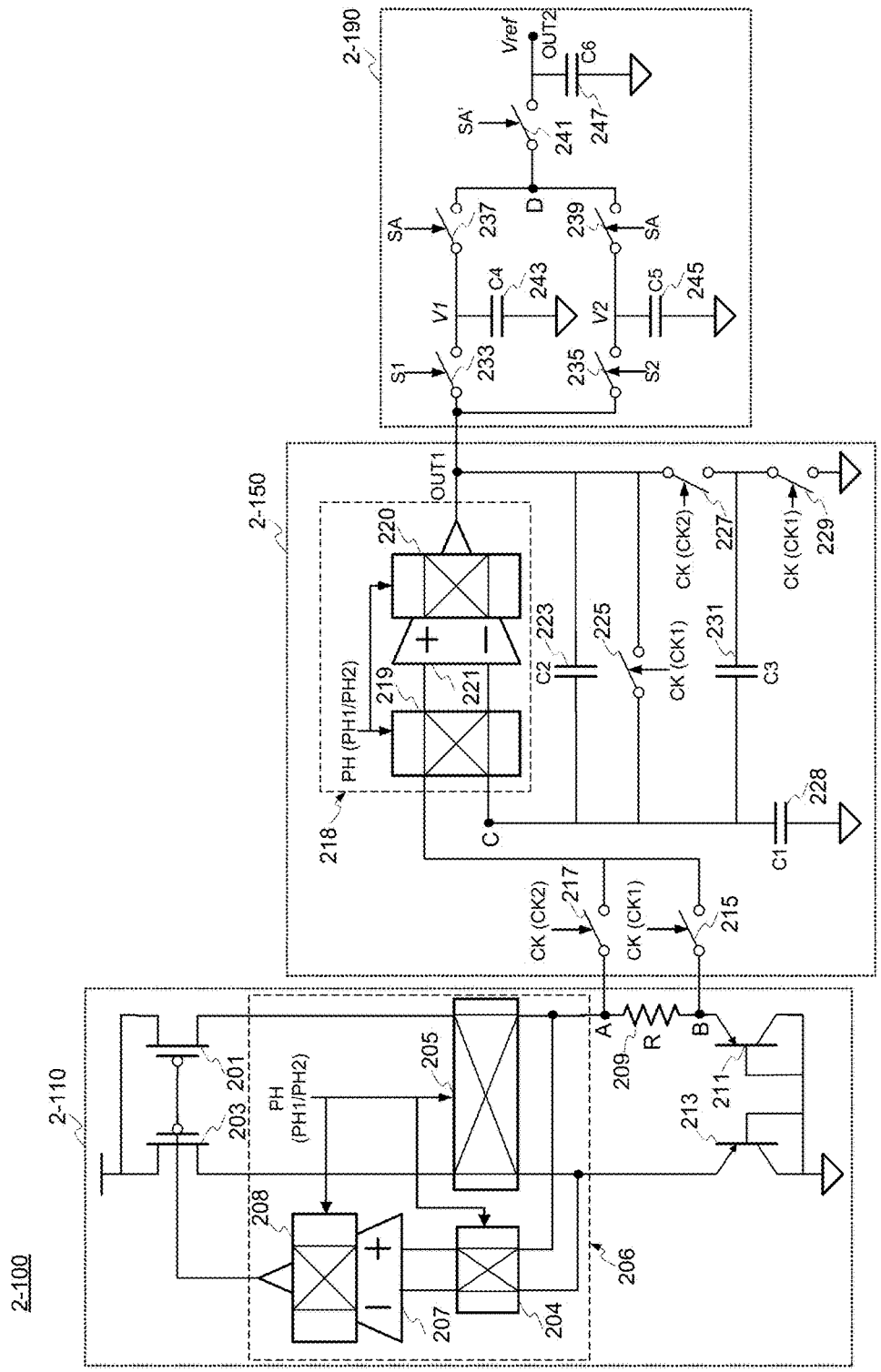
FIG. 2 is a circuit diagram of a bandgap reference circuit suitable for use as the bandgap reference circuit of FIG. 1 according to an embodiment.

FIG. 2 is a circuit diagram of a bandgap reference circuit 2-100 suitable for use as the bandgap reference circuit 1-100 of FIG. 1. The bandgap reference circuit 2-100 includes a bandgap core 2-110, a switched capacitor circuit 2-150, and a filter 2-190.

The bandgap core 2-100 includes a first transistor 201, a second transistor 203, a first chopped op-amp 206, a resistor 209, a first bipolar junction transistor (BJT) 211, and a second BJT 213. The first chopped op-amp 206 includes a first switching network 205, a first op-amp 207, a second switching network 208, and a third switching network 204.

The bandgap core 2-100 generates a bias current $I_b$ flowing through the first and second BJTs 211 and 213, and thus provides first and second voltages $V_A$ and $V_B$ at first and second nodes A and B, respectively, to the switched capacitor circuit 2-150.

A level of the second voltage $V_B$ at the second node B, which corresponds to a base-emitter voltage of the first BJT 211, is represented by Equation 1:

$$V_B = V_T \ln\left(\frac{I_b}{I_s}\right). \qquad \text{Equation 1}$$

In Equation 1, $V_T$ is a thermal voltage and $I_s$ is a saturation current of the first BJT 211. Equation 1 indicates that the second voltage $V_B$ is a CTAT voltage.

A magnitude of the bias current $I_b$, is represented by Equation 2:

$$I_b = \frac{V_T}{R} \ln(n). \qquad \text{Equation 2}$$

In Equation 2, R is a resistance value of the resistor 209, and n is a ratio of emitter areas of the first and second BJTs 211 and 213. Equation 2 indicates that the bias current $I_b$ is proportional to the thermal voltage $V_T$, and thus the bias current $I_b$ is a PTAT current.

Using Equation 2, a difference $V_{AB}$ between the first voltage $V_A$ and the second voltage $V_B$ is represented by Equation 3:

$$V_{AB} = I_b * R = V_T \ln\left(\frac{I_b}{I_s}\right) * R. \qquad \text{Equation 3}$$

Equation 3 indicates that the difference $V_{AB}$ between the first voltage $V_A$ and the second voltage $V_B$ is a PTAT voltage.

The first chopped op-amp 206 performs a chopping operation in response to a phase signal PH indicative of first and second phases PH1 and PH2 of chopping in order to reduce a first offset of the first op-amp 207. In an embodiment, the first phase PH1 corresponds to a logic high value of the phase signal PH and the second phase PH2 corresponds to a logic low value of the phase signal PH.

In an embodiment, the first switching network 205 couples its first and second inputs to its first and second outputs, respectively, when the phase signal PH has the first phase PH1, and couples its first and second inputs to its second and first outputs, respectively, when the phase signal PH indicates the first phase PH2. In an embodiment, the third switching network 204 couples its first and second inputs to its first and second outputs, respectively, when the phase signal PH has the first phase PH1, and couples its first and second inputs to its second and first outputs, respectively, when the phase signal PH indicates the first phase PH2.

In an embodiment, the second switching network 208 couples its first and second input to its first and second outputs, respectively, when the phase signal PH has the first phase PH1, and couples its first and second input to its second and first outputs, respectively, when the phase signal PH indicates the second phase PH2. For example, the first and second inputs of the second switching network 208 is coupled to internal differential signal nodes of the first op-amp 207, and one of the first and second outputs of the second switching network 208 is coupled to a single output node of the first op-amp 207.

The switched capacitor circuit 2-150 includes first, second, third, fourth, and fifth switching devices 215, 217, 225, 227, and 229, first, second, and third capacitive elements 228, 223, and 231, and a second chopped op-amp 218. The second chopped op-amp 218 includes a fourth switching network 219, a second op-amp 221, and a fifth switching network 220. In an embodiment, the first, second, and third capacitive elements 228, 223, and 231 are metal-oxide-metal (MOM) capacitors.

The first switching device 215 couples and decouples the second node B of the bandgap core 2-110 to a first input of the fourth switching network 219 in response to a clock signal CK. The first switching device 215 couples the second node B of the bandgap core 2-110 to the first input of the fourth switching network 219 when the clock signal CK has a first logic value CK1, and decouples when the clock signal CK has a second logic value CK2.

The second switching device 217 couples and decouples the first node A of the bandgap core 2-110 to the first input of the fourth switching network 219 in response to the clock signal CK. In an embodiment, the second switching device 217 couples the first node A of the bandgap core 2-110 to the first input of the fourth switching network 219 when the clock signal CK has the second logic value CK2, and decouples when the clock signal CK has the first logic value CK1.

In an embodiment, the first logic value CK1 is a logic high value and the second logic value CK2 is a logic low value. In another embodiment, the first switching device 215 operates in response to a first clock signal and the second switching device 217 operates in response to a second clock signal, and the second clock signal is an inverted version of the first clock signal.

The fourth switching network 219 has a second input coupled to the first, second, and third capacitive elements 228, 223, and 231 and the third switching device 225. The fourth switching network 219 has a first output and a second output coupled to a positive terminal and a negative terminal of the second op-amp 221, respectively.

In an embodiment, the fourth switching network 219 couples its first and second inputs to its first and second outputs, respectively, when the phase signal PH has the first phase PH1, and couples its first and second inputs to its second and first outputs, respectively, when the phase signal PH indicates the second phase PH2.

In an embodiment, the fifth switching network 220 couples its first and second inputs to its first and second outputs, respectively, when the phase signal PH has the first phase PH1, and couples its first and second inputs to its second and first outputs, respectively, when the phase signal PH indicates the second phase PH2. For example, the first and second inputs of the fifth switching network 220 is coupled to internal differential signal nodes of the second op-amp 221, and one of the first and second outputs of the fifth switching network 220 is coupled to a single output node of the second op-amp 221.

The second chopped op-amp 218 perform a chopping operation in response to the phase signal PH indicative of the first and second phases PH1 and PH2 of chopping. For example, when the phase signal PH is indicative of the first phase PH1, the second chopped op-amp 218 transmits a first signal from the first node A or the second node B through a first path and transmits a second signal from a third node C through a second path. When the phase signal PH is indicative of the second phase PH2, the second chopped op-amp 218 transmits the first signal from the first node A or the second node B through a third path and transmits the second signal from the third node C through a fourth path.

The second chopped op-amp 218 has an output coupled to a first output node OUT1. The first output node OUT1 is coupled to the second capacitive element 223, the third and fourth switching devices 225 and 227, and the filter 2-190.

In some embodiment, a first residual offset typically remains after the first chopped op-amp 206 performs the chopping operation and be transmitted to the first output node OUT1, and a second residual offset typically remains after the second chopped op-amp 218 performs the chopping operation and be transmitted to the first output node OUT1. For example, the first and second residual offsets result from a mismatch of capacitance, a parasitic capacitance, an intrinsic asymmetry of a current mirror configuration, or the like, in the first and op-amps 207 and 221, respectively.

The filter 2-190 includes sixth, seventh, eighth, ninth, and tenth switching devices 233, 235, 237, 239, and 241, and fourth, fifth, and sixth capacitive elements 243, 245, and 247. The filter 2-190 reduces the transmitted first and second residual offsets remaining after the chopping operations performed by the first and second chopped op-amps 206 and 218 to generate a reference voltage $V_{ref}$ at a second output node OUT2, as will be described below in more detail with reference to FIG. 3. In an embodiment, a capacitance C4 of the fourth capacitive element 243 is substantially equal to a capacitance C5 of the fifth capacitive element 245.

Figure 3:
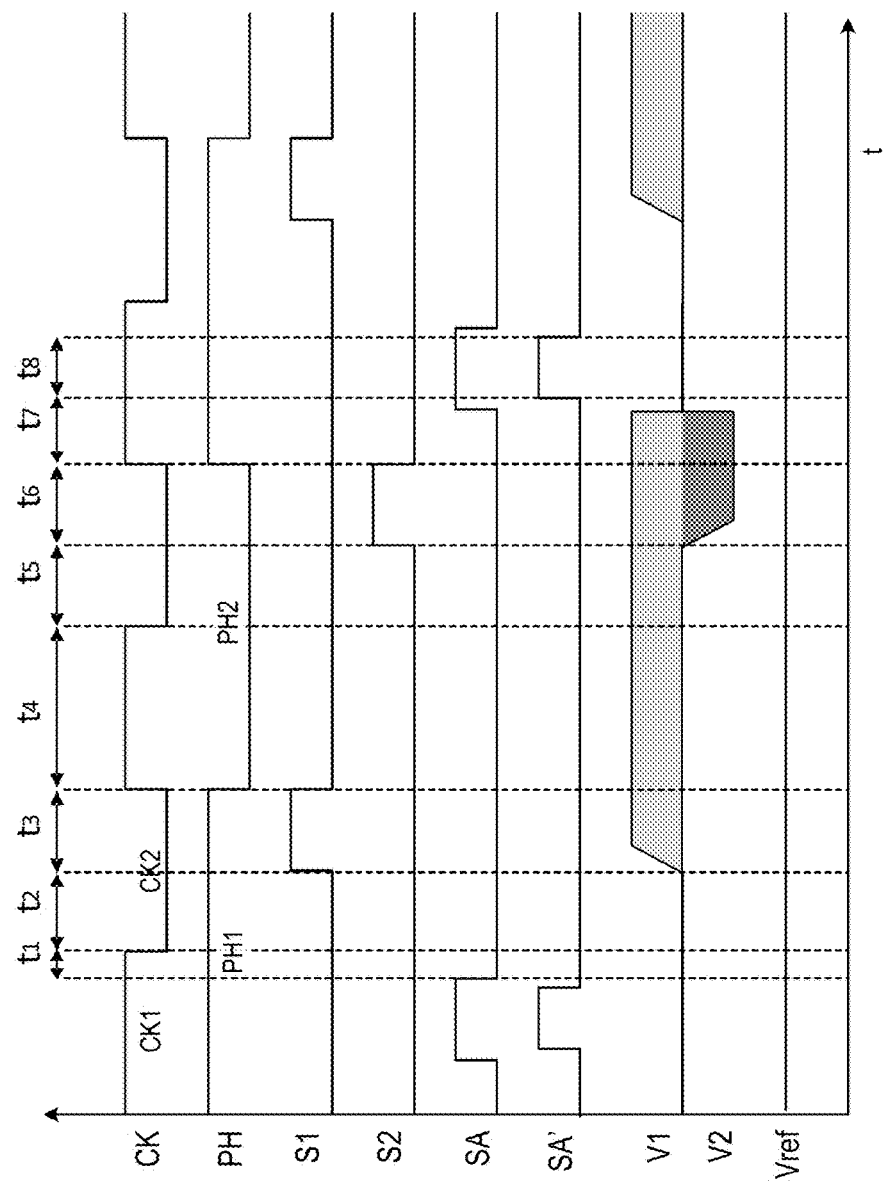
FIG. 3 illustrates waveforms related to an operation of the bandgap circuit of FIG. 2 according to an embodiment.

FIG. 3 illustrates waveforms related to an operation of the bandgap circuit 2-100 of FIG. 2 according to an embodiment.

Referring to FIG. 3, during a first time interval $t_1$, the clock signal CK has a first clock value CK1, and thus the first switching device 215, the third switching device 225, and the fifth switching device 229 are turned on. Thus, the second capacitive element 223 becomes shorted and the first and third capacitive elements 228 and 231 are charged to have substantially the same voltage as the second voltage $V_B$ at the second node B. In addition, the phase signal PH is indicative the first phase PH1, and thus the second node B is coupled to the first signal path of the second chopped op-amp 218. First ends of the first, second, and third capacitive elements 228, 223, and 231 are coupled to the second signal path of the second chopped op-amp 218. As a result, a level of a first output voltage $V_{OUT1}$ at the first output node OUT1 is represented by Equation 4:

$$V_{out1} = V_B + V_{OS} \qquad \text{Equation 4.}$$

In Equation 4, $V_{OS}$ is a residual offset voltage corresponding to a sum of the transmitted first and second residual offsets of the first and second op-amps 207 and 221.

During a second time interval $t_2$, the clock signal CK has a second clock value CK2, and thus the second switching device 217 and the fourth switching device 227 are turned on while the first, third, and fifth switching devices 215, 225, and 229 are turned off. Thus, the second capacitive element 223 is coupled to the third capacitive element 231 in series to form a capacitive feedback loop. In addition, the phase signal PH is indicative the first phase PH1, and thus the first node A is coupled to the first signal path of the second chopped op-amp 218. The second op-amp 221 adjusts the level of the first output voltage $V_{OUT1}$, using the capacitive feedback loop in an embodiment, until a voltage at a positive terminal of the second op-amp 221 becomes substantially equal to a voltage at a negative terminal of the second op-amp 221. As a result, the level of the first output voltage $V_{OUT1}$ at the first output node OUT1 is represented by Equation 5:

$$V_{out1} = \frac{C_2}{C_2+C_3}V_B + \frac{C_1+C_2+C_3}{C_2+C_3}V_{AB} + \frac{C_2}{C_2+C_3}V_{OS}. \qquad \text{Equation 5}$$

In Equation 5, $C_1$, $C_2$, and $C_3$ are respective capacitance values of the first, second, and third capacitive elements 228, 223, and 231. Hereinafter, the first, second and third terms of the first output voltage $V_{OUT1}$ in Equation 5 will be referred to a CTAT component, a PTAT component, and a first residual offset component, respectively.

During a third time interval $t_3$, a first switching signal S1 has a first logic value (e.g., a logic high value), and thus the sixth switching device 233 is turned on to couple the first output node OUT1 to a first end of the fourth capacitive element 243. As a result, the fourth capacitive element 243 is charged until a level of a first voltage V1 at the first end becomes substantially equal to the first output voltage $V_{OUT1}$ of Equation 5.

During a fourth time interval $t_4$, the first switching signal S1 has a second logic value (e.g., a logic low value), and thus the sixth switching device 233 is turned off. In addition, the clock signal CK has the first clock value CK1 and the phase signal PH is indicative of the second phase PH2, and thus the second node B is coupled to the third signal path of the second chopped op-amp 218. The first ends of the first, second, and third capacitive elements 228, 223, and 231 are coupled to the fourth signal path of the second chopped op-amp 218. As a result, the level of the first output voltage $V_{OUT1}$ at the first output node OUT1 is represented by Equation 6:

$$V_{out1} = V_B - V_{OS}$$  Equation 6.

During a fifth time interval $t_5$, the clock signal CK has the second clock value CK2, and thus the second switching device 217 and the fourth switching device 227 are turned on while the first, third, and fifth switching devices 215, 225, and 229 are turned off. Thus, the first node A is coupled to the third signal path of the second chopped op-amp 218. The second op-amp 221 adjusts the level of the first output voltage $V_{OUT1}$ until the voltage at the positive terminal becomes substantially equal to the voltage at the negative terminal. As a result, the level of the output voltage $V_{OUT1}$ at the first output node OUT1 is represented by Equation 7:

$$V_{out1} = \frac{C_2}{C_2 + C_3} V_B + \frac{C_1 + C_2 + C_3}{C_2 + C_3} V_{AB} - \frac{C_2}{C_2 + C_3} V_{OS}.$$  Equation 7

Hereinafter, the third term of the first output voltage $V_{OUT1}$ in Equation 7 will be referred to a second residual offset component.

During a sixth time interval $t_6$, a second switching signal S2 has a first logic value (e.g., a logic high value), and thus the seventh switching device 235 is turned on to couple the first output node OUT1 to a first end of the fifth capacitive element 245. As a result, the fifth capacitive element 245 is charged until a level of a second voltage V2 at the first end becomes substantially equal to the first output voltage $V_{OUT1}$ of Equation 7.

During a seventh time interval $t_7$, the second switching signal S2 has a second logic value (e.g., a logic low value) and the clock signal CK has the first clock value CK1. In addition, the first chopped op-amp 206 and the second chopped op-amp 218 operate in the first phase PH1 of chopping, and thus the level of the first output voltage $V_{OUT1}$ at the first output node OUT1 becomes equal to that of Equation 4.

During an eighth time interval $t_8$, third and fourth switching signals SA and SA' have a first logic value (e.g., a logic high value), and thus the eighth, ninth, and tenth switching devices 237, 239, and 241 are turned on to couple the first ends of the fourth and fifth capacitive elements 243 and 245 to a first end of the sixth capacitive element 247. The sixth capacitive element 247 averages the first and second voltages V1 and V2, and thus cancels out the first and second residual offset components $$\left(\text{e.g.,} + \frac{C_2}{C_2 + C_3} V_{OS} \text{ and } - \frac{C_2}{C_2 + C_3} V_{OS}\right)$$

included in the first and second voltages V1 and V2, respectively.

In an embodiment, the third switching signals SA may be set to the first logic value during the seventh time interval $t_7$, before the fourth switching signal SA' is set to the first logic value, as shown in FIG. 3. This allows the averaging of the first and second voltages V1 and V2 to begin at a fourth node D FIG. 2, before the fourth node D is coupled to the sixth capacitive element 247, and therefore reduces a potential voltage disturbance of the output node OUT2. In addition, the fourth switching signal SA' may be set the second logic value before the third switching signals SA is set to the second logic value, as shown in FIG. 3, in order to reduce the potential voltage disturbance of the output node OUT2.

The first end of the sixth capacitive element 247 is coupled to a second output node OUT2. As a result, a level of the reference voltage Vref at the second output node OUT2 is represented by Equation 8:

$$V_{ref} = \frac{C_2}{C_2 + C_3} V_B + \frac{C_1 + C_2 + C_3}{C_2 + C_3} V_{AB}.$$  Equation 8

According to Equation 8, the reference voltage Vref is substantially independent of the first and second residual offset components. Because the first and second residual offset components are proportional to the remaining portions of the offsets of the first and second op-amps 207 and 221 after the chopping operations have been performed, the reference voltage Vref is also substantially independent of the offsets of the first and second op-amps 207 and 221.

Figure 4:
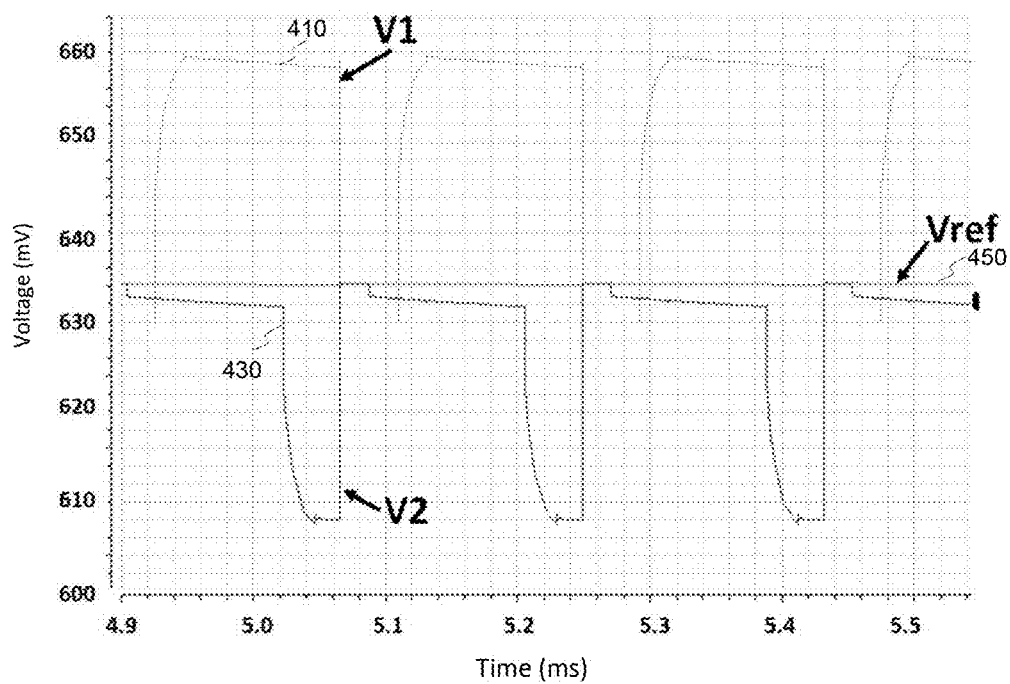
FIG. 4 shows profiles of a first voltage, a second voltage, and a reference voltage of FIG. 2 according to an embodiment.

FIG. 4 shows profiles 410, 430, and 450 of a first voltage V1 (e.g., the first voltage V1 of FIG. 2), a second voltage V2 (e.g., the second voltage V2 of FIG. 2), and a reference voltage Vref (e.g., the reference voltage Vref of FIG. 2), respectively, according to an embodiment.

Referring to FIG. 4, after applying chopping technique to reduce offsets of first and second op-amps (e.g., the first and second op-amps 207 and 221 of FIG. 2) according to an embodiment of the present disclosure, the first and second voltages V1 and V2 include first and second residual offset components, respectively, that deviate from a target value of the reference voltage Vref. A filter (e.g., the filter 2-190 of FIG. 2) according to an embodiment of the present disclosure cancels out the first and second residual offset components to make the reference voltage Vref substantially independent of the offsets of the first and second op-amps, and thus provides an accurate reference voltage. In addition, such a filter has a size smaller than that of a conventional low-pass filter (LPF), and thus saves a circuit area.

Figure 5:
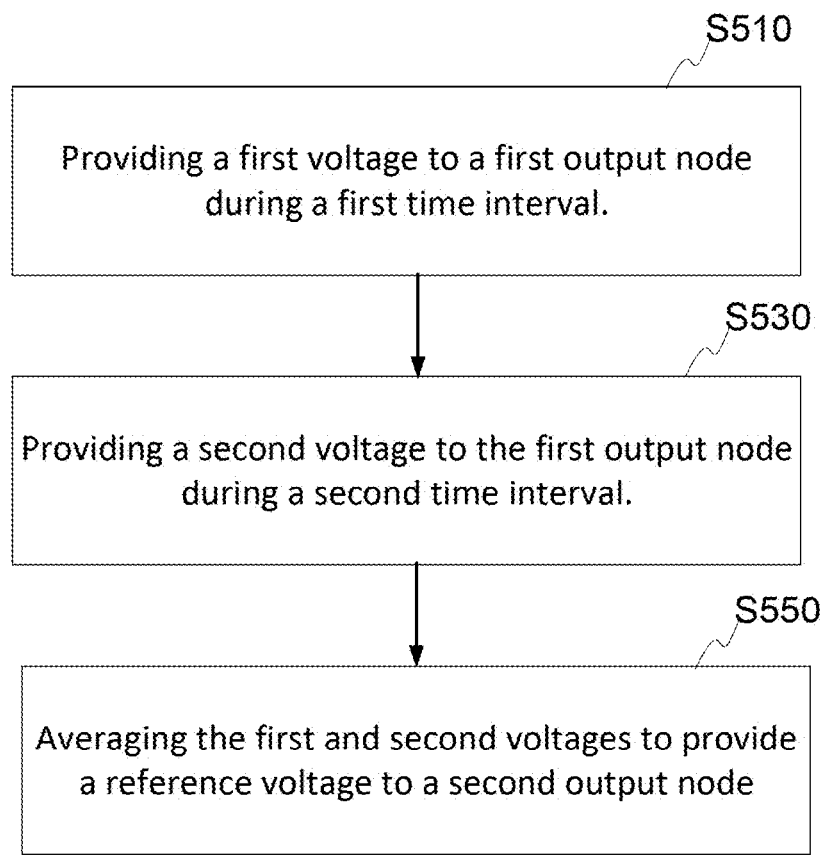
FIG. 5 is a flowchart that illustrates a process performed by a bandgap reference circuit according to an embodiment.

FIG. 5 is a flowchart that illustrates a process performed by a bandgap reference circuit (e.g., the bandgap reference circuit 2-100 of FIG. 2) according to an embodiment. In an embodiment, the bandgap reference circuit includes a bandgap core, a switched capacitor circuit, and a filter.

At S510, the bandgap reference circuit provides a first voltage to a first output node during a first time interval. The first voltage includes a PTAT component, a CTAT component, and a first residual offset component.

At S530, the bandgap reference circuit provides a second voltage to the first output node during a second time interval. The second voltage includes the PTAT component, the CTAT component, and a second residual offset component.

In an embodiment, the bandgap reference circuit includes first and second chopped op-amps. The first and second chopped op-amps include first and second op-amps, respectively, and each of the first and second residual offset components is associated with offsets of the first and second op-amps.

At S550, the bandgap reference circuit averages the first and second voltages to provide a reference voltage to a second output node. In an embodiment, the first residual offset component has substantially the same magnitude as and an opposite polarity to the second residual offset component, and thus the reference voltage is substantially independent of the first and second residual offset components.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A method comprising:
providing, during a first time interval, a first voltage to a first output node, wherein the first voltage is provided as an output signal of a chopped operational amplifier (op-amp), and wherein the first voltage includes (i) a proportional-to-absolute-temperature (PTAT) component, (ii) a complementary-to-absolute-temperature (CTAT) component, and (iii) a first residual offset component;
providing, during a second time interval, a second voltage to the first output node, wherein the second voltage is also provided as the output signal of the chopped op-amp, and wherein the second voltage includes (i) the PTAT component, (ii) the CTAT component, and (iii) a second residual offset component; and
averaging the first voltage and the second voltage to provide a reference voltage to a second output node.

2. The method of claim 1, further comprising:
coupling a first end of a first capacitive element to the first output node according to a first switching signal; and
coupling a first end of a second capacitive element to the first output node according to a second switching signal,
wherein a second end of the first capacitive element and a second end of the second capacitive element are coupled to a ground.

3. The method of claim 2, further comprising:
coupling a first end of a third capacitive element to the first end of the first capacitive element and the first end of the second capacitive element according to a third switching signal,
wherein the first end of the third capacitive element is coupled to the second output node and a second end of the third capacitive element is coupled to the ground.

4. The method of claim 1, further comprising:
coupling a first input node to a first signal path of the chopped op-amp according to a clock signal indicative of a first value and a phase signal indicative of a first phase;
coupling the first output node to a second signal path of the chopped op-amp according to the clock signal indicative of the first value and the phase signal indicative of the first phase;
coupling first ends of first, second, and third capacitive elements to the second signal path of the chopped op-amp according to the phase signal indicative of the first phase; and
coupling a second end of the third capacitive element to a ground according to the clock signal indicative of the first value.

5. The method of claim 4, further comprising:
coupling a second input node to the first signal path of the chopped op-amp according to the clock signal indicative of a second value and the phase signal indicative of the first phase;
decoupling the second end of the third capacitive element from the ground according to the clock signal indicative of the second value;
coupling a second end of the second capacitive element to the second end of the third capacitive element according to the clock signal indicative of the second value; and
adjusting a level of a voltage at the first output node to provide the first voltage.

6. The method of claim 4, further comprising:
coupling the first input node to a third signal path of the chopped op-amp according to the clock signal indicative of the first value and the phase signal indicative of a second phase; and
coupling the first ends of the first, second, and third capacitive elements to a fourth signal path of the chopped op-amp according to the phase signal indicative of the second phase.

7. The method of claim 6, further comprising:
coupling a second input node to the third signal path of the chopped op-amp according to the clock signal indicative of a second value and the phase signal indicative of the second phase;
decoupling the second end of the third capacitive element from the ground according to the clock signal indicative of the second value;
coupling a second end of the second capacitive element to the second end of the third capacitive element according to the clock signal indicative of the second value; and
adjusting a level of a voltage at the first output node to provide the second voltage.

8. The method of claim 1, wherein the chopped op-amp is a first chopped op-amp, the method further comprising:
generating a PTAT current using a second chopped op-amp according to a phase signal; and
multiplying the PTAT component, the CTAT component, and the first residual offset component and adding the multiplied PTAT component, CTAT component, and first residual offset component to provide the first voltage using the first chopped op-amp according to the phase signal indicative of a first phase and a clock signal.

9. The method of claim 8, further comprising:
multiplying the PTAT component, the CTAT component, and the second residual offset component and adding the multiplied PTAT component, CTAT component, and second residual offset component to provide the second voltage using the first chopped op-amp according to the phase signal indicative of a second phase and the clock signal,
wherein each of the first and second residual offset components is associated with a first offset of the first chopped op-amp and a second offset of the second chopped op-amp.

10. An apparatus comprising:
a discrete-time circuit to provide a first voltage to a first output node during a first time interval and to provide a second voltage to the first output node during a second time interval, the first voltage including a proportional-to-absolute-temperature (PTAT) component, a complementary-to-absolute-temperature (CTAT) component, and a first residual offset component, the second voltage including the PTAT component, the CTAT component, and a second residual offset component; and
a filter to average the first and second voltages to provide a reference voltage to a second output node,
wherein the discrete-time circuit includes a chopped operational amplifier (op-amp), and wherein the chopped op-amp (i) provides, during the first time interval, the first voltage as an output signal to the first output node, and (ii) provides, during the second time interval, the second voltage as the output signal to the first output node.

11. The apparatus of claim 10, wherein the filter includes:
a first capacitive element coupled to the first output node and a ground;
a first switching device to couple a first end of the first capacitive element to the first output node according to a first switching signal;
a second capacitive element coupled to the first output node and the ground; and
a second switching device to couple a first end of the second capacitive element to the first output node according to a second switching signal,
wherein a second end of the first capacitive element and a second end of the second capacitive element are coupled to the ground.

12. The apparatus of claim 11, wherein the filter further includes:
a third capacitive element coupled to the second output node and the ground;
a third switching device to couple a first end of the third capacitive element and a third output node according to a third switching signal;
a fourth switching device to couple the first end of the first capacitive element to the third output node according to a fourth switching signal; and
a fifth switching device to couple the first end of the second capacitive element to the third output node according to a fifth switching signal.

13. The apparatus of claim 10, wherein the discrete-time circuit is a switched capacitor circuit,
wherein the chopped op-amp includes a first switching network, an op-amp, a second switching network, and an output, the first and second switching networks to provide first and second signal paths according to a phase signal indicative of a first phase, and
wherein the switched capacitor circuit includes:
a first switching device to couple a first input node to the first signal path of the chopped op-amp according to a clock signal indicative of a first value;
a second switching device to couple the first output node to a second signal path of the chopped op-amp according to the clock signal indicative of the first value;
first, second, and third capacitive elements each having a first end coupled to the second signal path of the chopped op-amp; and
a third switching device to couple a second end of the third capacitive element to a ground according to the clock signal indicative of the first value.

14. The apparatus of claim 13, wherein the switched capacitor circuit further includes:
a fourth switching device to couple a second input node to the first signal path of the chopped op-amp according to the clock signal indicative of a second value; and
a fifth switching device to couple a second end of the second capacitive element to the second end of the third capacitive element according to the clock signal indicative of the second value,
wherein the third switching device decouples the second end of the third capacitive element from the ground according to the clock signal indicative of the second value, and
wherein the chopped op-amp adjusts a level of the output coupled to the first output node to provide the first voltage.

15. The apparatus of claim 13, wherein the first and second switching networks provides third and fourth signal paths according to the phase signal indicative of a second phase,
wherein the first switching device couples the first input node to the third signal path of the chopped op-amp according to the clock signal indicative of the first value, and
wherein the first ends of the first, second, and third capacitive elements are coupled to the fourth signal path of the chopped op-amp.

16. The apparatus of claim 15, wherein the switched capacitor circuit further includes:
a fourth switching device to couple a second input node to the third signal path of the chopped op-amp according to the clock signal indicative of a second value; and
a fifth switching device to couple a second end of the second capacitive element to the second end of the third capacitive element according to the clock signal indicative of the second value,
wherein the third switching device decouples the second end of the third capacitive element from the ground according to the clock signal indicative of the second value, and
wherein the chopped op-amp adjusts a level of the output coupled to the first output node to provide the second voltage.

17. The apparatus of claim 10, wherein the discrete-time circuit is a switched capacitor circuit and the chopped op-amp is a first chopped op-amp, the apparatus further comprising a bandgap core to generate a PTAT current according to a phase signal, the bandgap core including a second chopped op-amp, the second chopped op-amp including a first switching network, a first op-amp, a second switching network, and a third switching network, and
wherein the switched capacitor circuit is configured to multiply the PTAT component, the CTAT component, and the first residual offset component and to add the multiplied PTAT component, CTAT component, and first residual offset component to provide the first voltage according to the phase signal indicative of a first phase and a clock signal, the first chopped op-amp including a fourth switching network, a second op-amp, and a fifth switching network.

18. The apparatus of claim 17, wherein the switched capacitor circuit is further configured to multiply the PTAT component, the CTAT component, and the second residual offset component and to add the multiplied PTAT component, CTAT component, and second residual offset components to provide the second voltage according to the phase signal indicative of a second phase and the clock signal, and
wherein each of the first and second residual offset components is associated with a first offset of the first op-amp and a second offset of the second op-amp.

19. The method of claim 1, wherein the chopped op-amp is a first chopped op-amp, the method further comprising:
canceling out the first and second residual offset components to generate the reference voltage,
wherein each of the first and second residual offset components is associated with a first offset of the first chopped op-amp and a second offset of the second chopped op-amp.

20. A method comprising:
providing, during a first interval, a first voltage to a first output node, the first voltage including a proportional-to-absolute-temperature (PTAT) component, a complementary-to-absolute-temperature (CTAT) component, and a first residual offset component;
providing, during a second interval, a second voltage to the first output node, the second voltage including the PTAT component, the CTAT component, and a second residual offset component;
averaging the first voltage and the second voltage to provide a reference voltage to a second output node;
coupling a first end of a first capacitive element to the first output node according to a first switching signal; and
coupling a first end of a second capacitive element to the first output node according to a second switching signal.

* * * * *